(12) United States Patent
Wegner

(10) Patent No.: US 7,276,963 B2
(45) Date of Patent: Oct. 2, 2007

(54) SWITCHING POWER AMPLIFIER AND METHOD FOR AMPLIFYING A DIGITAL INPUT SIGNAL

(75) Inventor: Carsten Wegner, Siegen (DE)

(73) Assignee: Cameo Produktions-und Vertriebs GmbH fuer Beschallungs und Beleuchtungsanlagen, Wenden-Gerlingen (DE)

( * ) Notice: Subject to any disclaimer, the term of this patent is extended or adjusted under 35 U.S.C. 154(b) by 87 days.

(21) Appl. No.: 11/221,765

(22) Filed: Sep. 9, 2005

(65) Prior Publication Data

US 2006/0091945 A1    May 4, 2006

Related U.S. Application Data

(60) Provisional application No. 60/622,625, filed on Oct. 28, 2004.

(51) Int. Cl.
*H03F 3/38* (2006.01)

(52) U.S. Cl. .................................... 330/10; 330/207 A
(58) Field of Classification Search .................. 330/10, 330/251, 207 A
See application file for complete search history.

(56) References Cited

U.S. PATENT DOCUMENTS 4,724,396 A * 2/1988 Taylor et al. .................. 330/10
6,741,123 B1 * 5/2004 Andersen et al. ............. 330/10
6,768,779 B1 7/2004 Nielsen
6,998,911 B2 * 2/2006 Honda et al. .................. 330/10

FOREIGN PATENT DOCUMENTS

WO    98/44626    10/1998

* cited by examiner

*Primary Examiner*—Henry Choe
(74) *Attorney, Agent, or Firm*—Greenblum & Bernstein, P.L.C.

(57)    ABSTRACT

Switching power amplifier includes a first signal path having a pulse modulator for modulating an input signal, and a switching power unit for amplifying the modulated signal to generate an amplified output signal; a second signal path for generating a reference signal in response to the input signal; and a sigma delta feedback loop having a substractor for substracting the generated reference signal from the amplified input signal to generate an error signal, an analogue noise shaper for integrating the error signal to generate an integrated error signal, and a quantizer for converting the integrated error signal into a digital feedback signal which is fed back to the first signal path.

27 Claims, 19 Drawing Sheets first embodiment

PULSE MODULATION METHODS state of the art

Delay Correction Unit
10

Signal Delay Measurement Unit 13

*Low Pass Filter 17*

SWITCHING POWER AMPLIFIER AND METHOD FOR AMPLIFYING A DIGITAL INPUT SIGNAL

CROSS-REFERENCE TO RELATED APPLICATIONS

This application claims the benefit of U.S. Provisional Application No. 60/622,625, filed Oct. 28, 2004.

FIELD OF THE INVENTION

This invention relates to the field of digital power amplifiers.

BACKGROUND OF THE INVENTION

Power amplifiers are in particular used for amplifying electro-acoustic signals. A power amplifier has the task of amplifying an audio signal to a level that, combined with sufficient current to move the coil, produces the desired acoustic level from the loudspeaker. Power amplifiers are capable of delivering larger amounts of undistorted power to produce the subjective acoustic levels demanded by the consumer.

Audio amplifiers are electronic amplifiers that work with audio frequencies, i.e. in a frequency range up to approximately 20 KHz. Applications of power amplifiers are instrument amplifiers and sound systems for home, automotive and public use. The soundcard in a personal computer contains several audio amplifiers as does every stereo sound system.

Power amplifiers can be appropriately distinguished by their output power. Most devices include more than one type of audio power amplifier The key design parameters of power amplifiers are frequency response, gain, noise and distortion. These design parameters are interdependent, wherein desirable higher gains of the frequency response often lead to undesirable increases in noise and distortion.

Early audio amplifiers were based on vacuum tubes. Audio amplifiers based on transistors became practical with the availability of cheap transistors. Operational amplifiers which include transistors, can also be used for audio amplification, for instance in pre-amplifier stages and tone control circuits.

Conventional analogue power amplifiers suffer from low efficiency. This is critical since power amplifiers handle considerable amounts of power. Accordingly, conventional analogue power amplifiers are in general provided with heat sinks of extruded aluminium to cope with the heat development. Negative side effects of inefficient power amplification includes high volume, weight, cost and reliability problems. Moreover, conventional analogue power amplifiers have lower energy utilization.

To increase efficiency of amplification switching power stages have been proposed which are well-known in the state of the art. A conventional switching power amplifier comprises a modulator, a switching power stage and a demodulation filter to reconstitute the modulated signal. Such a switching power amplifier is also called a class-D-amplifier. The non-linearity of the switching power stage within a class-D-amplifier presents a significant impediment to maintain the modulator performance throughout the subsequent power conversion by the switching power stage.

FIG. 1 shows a pulse modulation amplifier (PMA) having a class-D-power stage according to the state of the art. The PMA-power amplifier comprises a pulse modulator, a switching power stage, a demodulation filter and an error correction block. The pulse modulator is based on analogue or digital pulse modulation technique. The switching power stage connected to the output of the pulse modulator is supplied with DC power and converts the pulse modulated input signal to power level. Subsequently, the amplified pulse modulated signal is fed to a demodulation filter to reconstitute the modulated signal. The error correction control unit is provided for compensating any errors that are introduced during the pulse modulation, the power amplification or the demodulation.

The pulse modulator is the core element of the PMA power amplifier as shown in FIG. 1. The most common analogue pulse modulation methods for PMA-amplifiers are PWM (Pulse Width Modulation) and PDM (Pulse Density Modulation).

FIG. 2 shows four basic pulse modulation techniques according to the state of the art, i.e. pulse amplitude modulation (PAM), pulse width modulation (PWM), pulse position modulation (PPM) and pulse density modulation (PDM).

Pulse width modulation PWM is different from PAM in that it provides the information in time whereas PAM provides it in the amplitude. Consequently, the information is coded into the time position of the transition within each switching interval.

Pulse position modulation (PPM) differs from PWM in that the value of each instantaneous sample of a modulating wave causes the variation of the position in time of a pulse relative to its non-modulated time of occurrence. Each pulse has an identical shape independent of the modulation depths.

Pulse density modulation (PDM) as shown in FIG. 2d is based on a unity pulse width, height and a constant time of occurrence for the pulse width in the switching period. The modulated parameter is the presence of the pulse. For each sample interval it is determined, if the pulse should be present or not, i.e. the density of the pulses is modulated.

Most conventional PMA-amplifier according to the state of the art as shown in FIG. 1 employ a PWM pulse modulator. Pulse width modulation (PWM) can be categorized in to major classes by the sampling method, i.e. a natural sampling PWM (NPWM) and an uniform sampling PWM (UPWM). The cited sampling method PWM can also be differentiated by the edge. The edge modulation may be single-sided or double-sided. The modulation of both edges doubles the information contained in the resulting pulse train although the pulse train frequency is the same. PWM is used to vary the total amount of power delivered to a load such as a loudspeaker without the losses which normally occur when the power source drops its output voltage through resistive means. In theory, the power conversion within a switching power amplification stage has almost 100% efficiency. Furthermore, the power conversion is in general perfectly linear and does not contribute distortion or noise. A real power amplification stage has a limited efficiency and contributes some distortion and noise.

The error correction control unit within a conventional PMA-power amplifier as shown in FIG. 1 compensates errors. The output of the pulse modulator generally contains three distinct signal elements, i.e. the modulated output signal, distortion signal components related to the modulated signal and a high-frequency signal. The high-frequency signal output by the pulse modulator is composed of discrete components related to the signal carrier, intermodulations between carrier and signal, and a shaped noise signal.

To eliminate the error sources related to the switching power stage and the demodulation filter while maintaining the demodulator performance a digital PMA-power amplifier according to the state of the art as shown in FIG. 3 has been described in WO 98/44626. As can be seen from FIG. 3, an edge delay correction unit is provided between the pulse modulator and the switching power stage. The output signal of the pulse modulator is fed to the edge delay correction unit which corrects or "pre-distorts" the pulse modulated signal to generate a compensated pulse signal, such that the non-ideal behaviour within the subsequent power conversion and demodulation are eliminated. This is carried out by means of pulse edge delays on each of the pulse edges controlled by an input control signal generated by a error processing unit within the switching power stage which amplifies the pulses coming from the pulse modulator.

The errors caused by the switching power stage can be divided into pulse timing errors PTE and pulse amplitude errors PAE.

The pulse timing errors PTE arise because the delays from turn-on to turn-off to actual transition at the output of the switching power stage are different in the turn-on and turn-off phase. Furthermore, rising and falling edges of the signals are not infinitely fast.

The pulse amplitude errors PAE can arise from noise caused by the power supply that feeds the switching power stage. Any power supply ripple or noise intermodulates with the modulated audio signal. Furthermore, power switches within the switching power stage have a finite impedance. Additional errors are caused by non-ideal modulation and non-ideal demodulation.

The demodulation filter connected to the output of the switching power stage introduces further distortion and increases the total output impedance and consequently changes in the load impedance which changes the frequency response.

In the PMA-power amplifier according to the state of the art, the error sources, i.e. the pulse amplitude errors PAE and the pulse timing errors PTE are corrected by intelligent pulse retiming as explained with reference to FIG. 4.

The edge delay correction unit of the conventional PMA-power amplifier as shown in FIG. 3 comprises an integrated circuit limiter and a comparator. The modulated output signal is applied to the edge delay correction unit which provides compensation for the PAE-errors and PTE-errors by delaying the individual pulse edges in response to a control signal generated by the error processing unit. The pulse edge correction will be performed by delaying a leading edge of a pulse or a trailing edge of a pulse or both edges of a pulse. FIG. 4 illustrates the functionality of a linear double edge delay correction unit.

FIG. 3 shows an implementation of a double-sided edge delay correction unit within the conventional PMA-amplifier according to the state of the art as described in WO 98/44626.

The PMA-power amplifier according to the state of the art as described in WO 98/44626 and as shown in FIG. 3 comprises some severe draw-backs. A first disadvantage is that the edge delay correction unit according to the state of the art as shown in FIG. 3 does only work with a conventional pulse width modulated signal (PWM) as shown in FIG. 2b and not with other pulse width modulated signals.

Furthermore, the PMA-power amplifier as shown in FIG. 3 has a linear feedback in the analogue signal domain. The output of the demodulation filter is fed back to the error processing unit which outputs the control signal $v_e$ to the comparator. This analogue feedback signal can cause an overdrive of the edge delay correction unit, i.e. the analogue feedback loop causes stability problems and is inclined to oscillation. Furthermore, the control range is very limited. As can be seen from FIG. 4 the signal edge of an integrated $v_e$ has a predefined slope and lasts for a comparatively short time. The control range for adjusting the delay corresponds to the time period of the signal edges of the integrated signal $v_e$. Consequently, the control range for performing a controlled edge delay is very small.

Accordingly, it is the object of the present invention to provide a switching power amplifier and a method for amplifying a digital input signal which compensates errors caused by a switching power stage and a demodulation filter with a stable feedback loop.

SUMMARY OF THE INVENTION

The invention provides a switching power amplifier and a method for amplifying a digital input signal which work stable in a predetermined frequency range of the input signal. The switching power amplifier comprises a first signal path for amplifying a digital input signal and a second signal path for generating a reference signal in response to the digital input signal. The first signal path comprises a pulse modulator for modulating the digital input signal and a switching power unit for amplifying the modulated signal to generate an amplified output signal. A second signal path for generating the reference signal in response to the digital input signal is provided. Further, a Sigma-Delta-feedback-loop is provided having a substractor for substracting the generated reference signal from the amplified input signal to generate an error signal, an analogue noise shaper for integrating the error signal to generate an integrated error signal and a quantizer for converting the integrated error signal into a digital feedback signal which is fed back to the first signal path.

The switching power amplifier and the method for amplifying a digital input signal according to the present invention have the advantage that the feedback loop for error compensation is closed in the digital signal domain.

A further advantage of the switching power amplifier and the method according to the present invention resides in that it works with any pulse modulated signal. Accordingly, the principle of the present invention can be applied for the amplification of any pulse modulated signal providing flexibility in the design of a power amplifier.

Other objects and advantages of the present invention become apparent to those skilled in the art from the following specification.

DETAILED DESCRIPTION OF THE DRAWINGS

Figure 1:
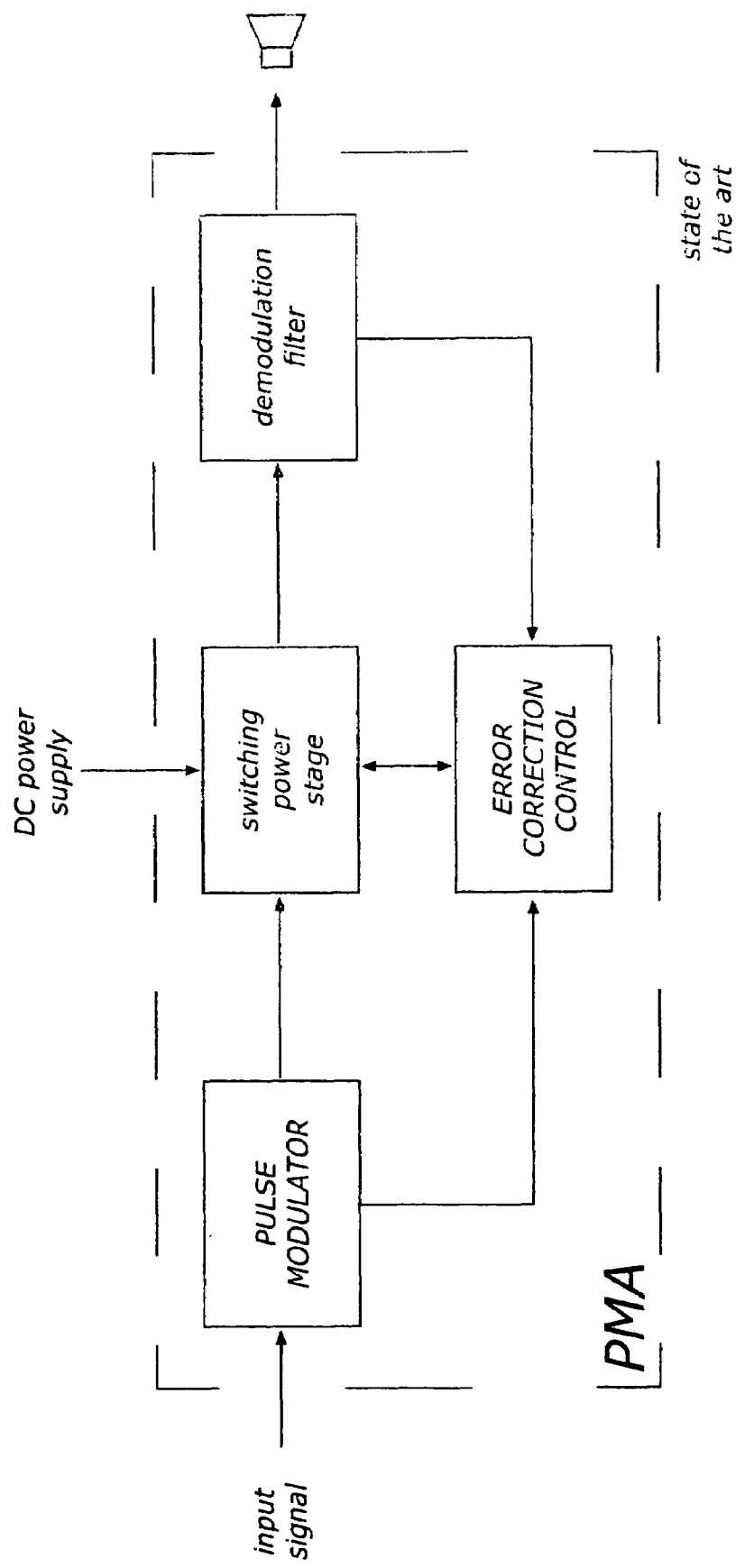
FIG. 1 is a block diagram of a conventional PMA-power amplifier according to the state of the art.
Figure 2:
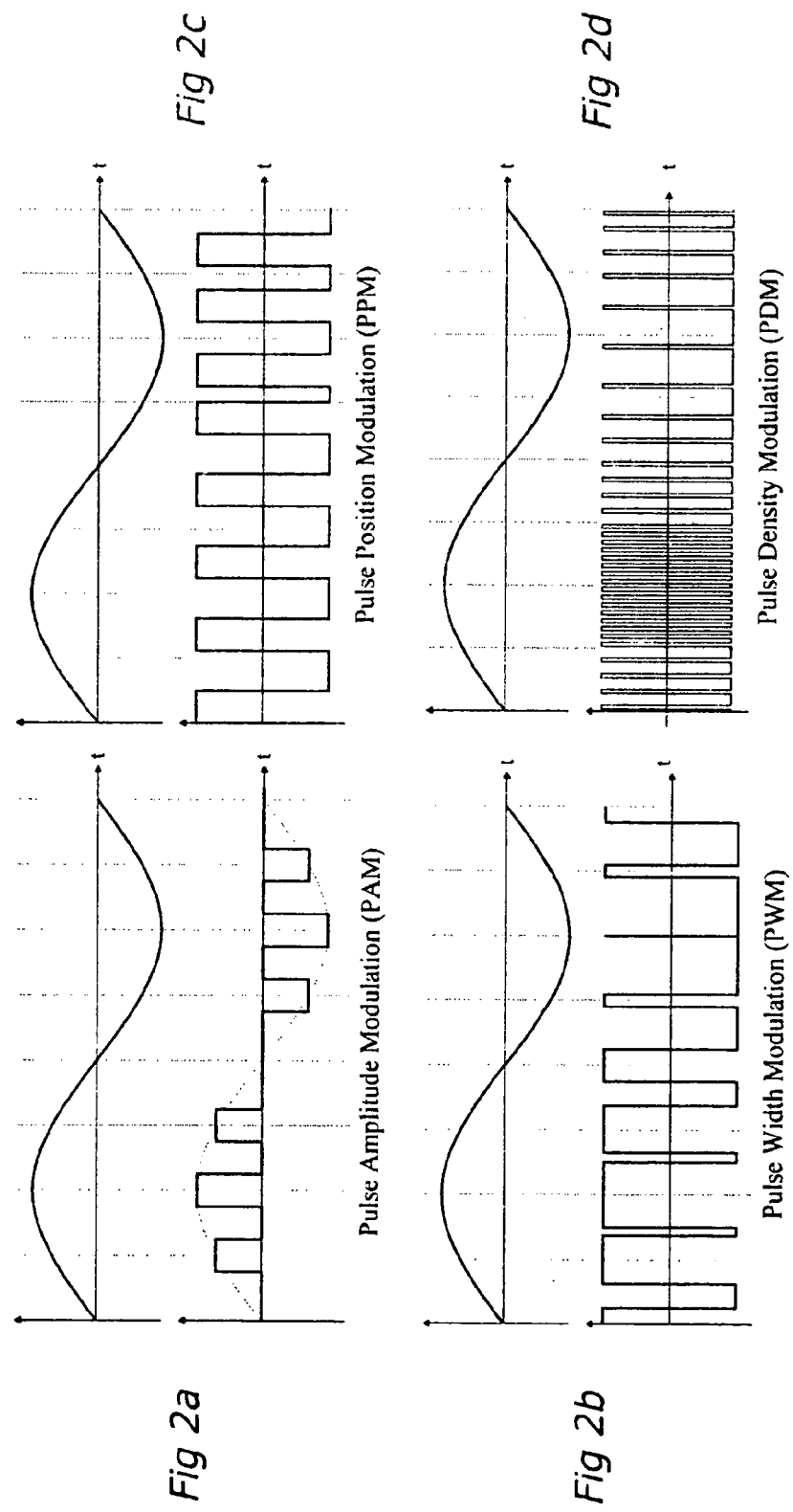
FIGS. 2a, 2b, 2c, 2d are signal diagrams of pulse modulated signals according to the state of the art.
Figure 3:
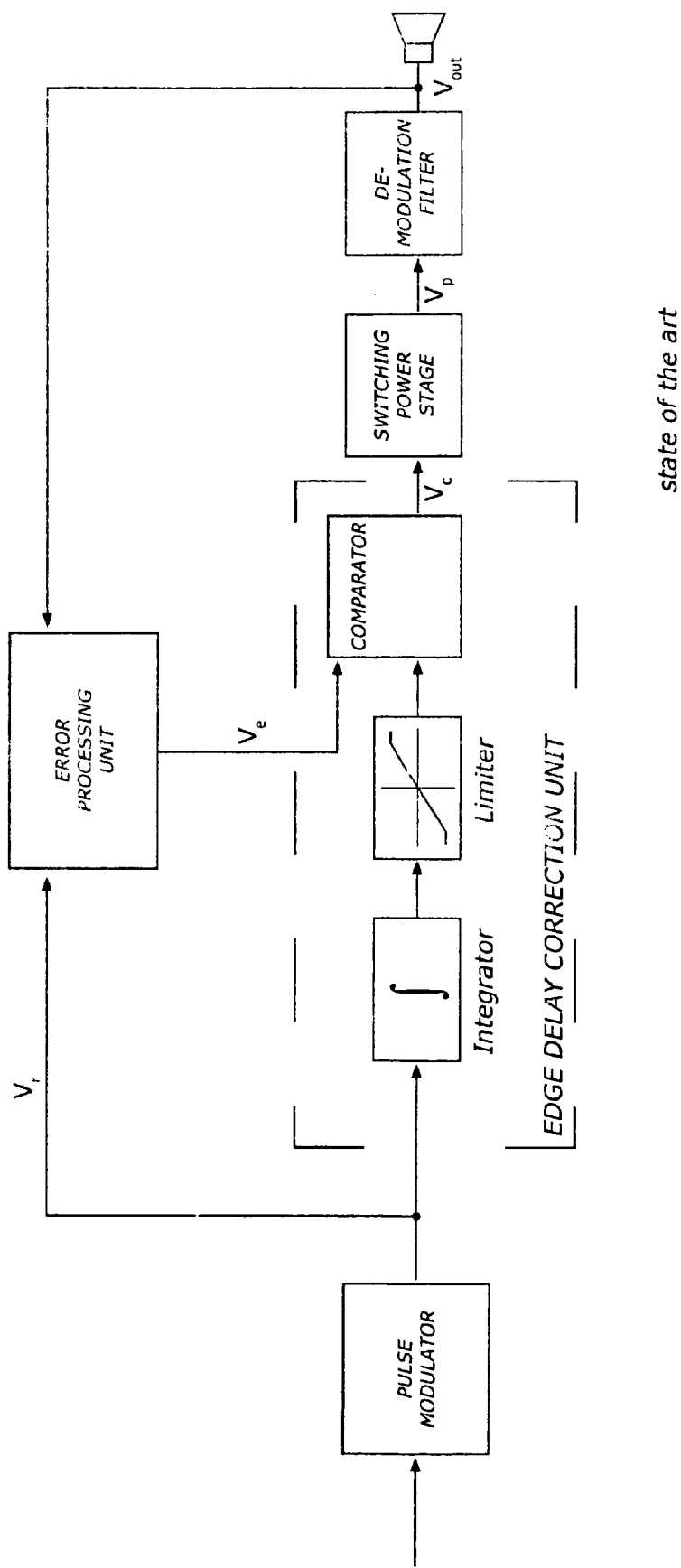
FIG. 3 is a block diagram of a PMA-power amplifier according to the state of the art having an edge delay correction unit.
Figure 4:
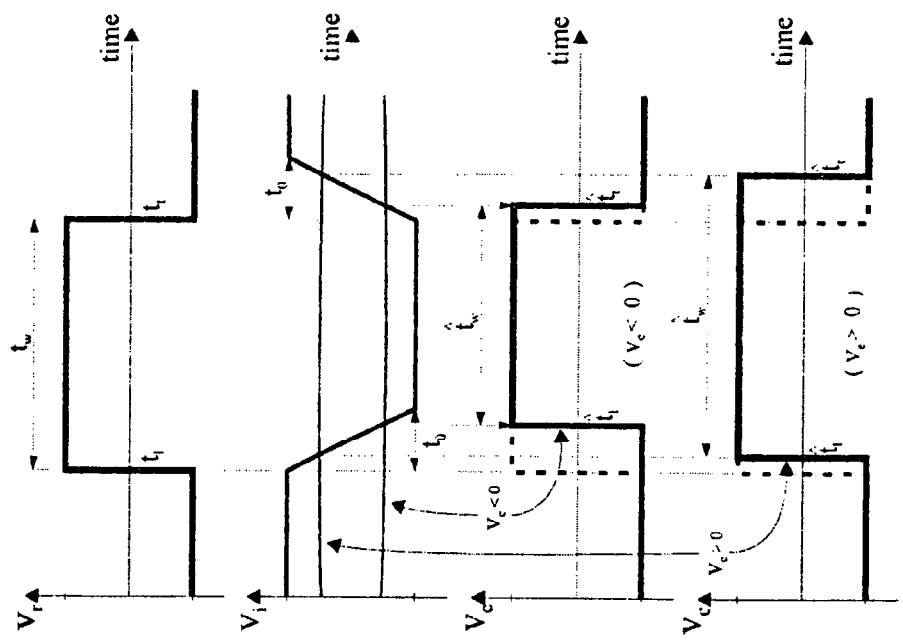
FIG. 4 shows signal diagrams for illustrating the functionality of the conventional PMA-power amplifier as shown in FIG. 3.
Figure 5:
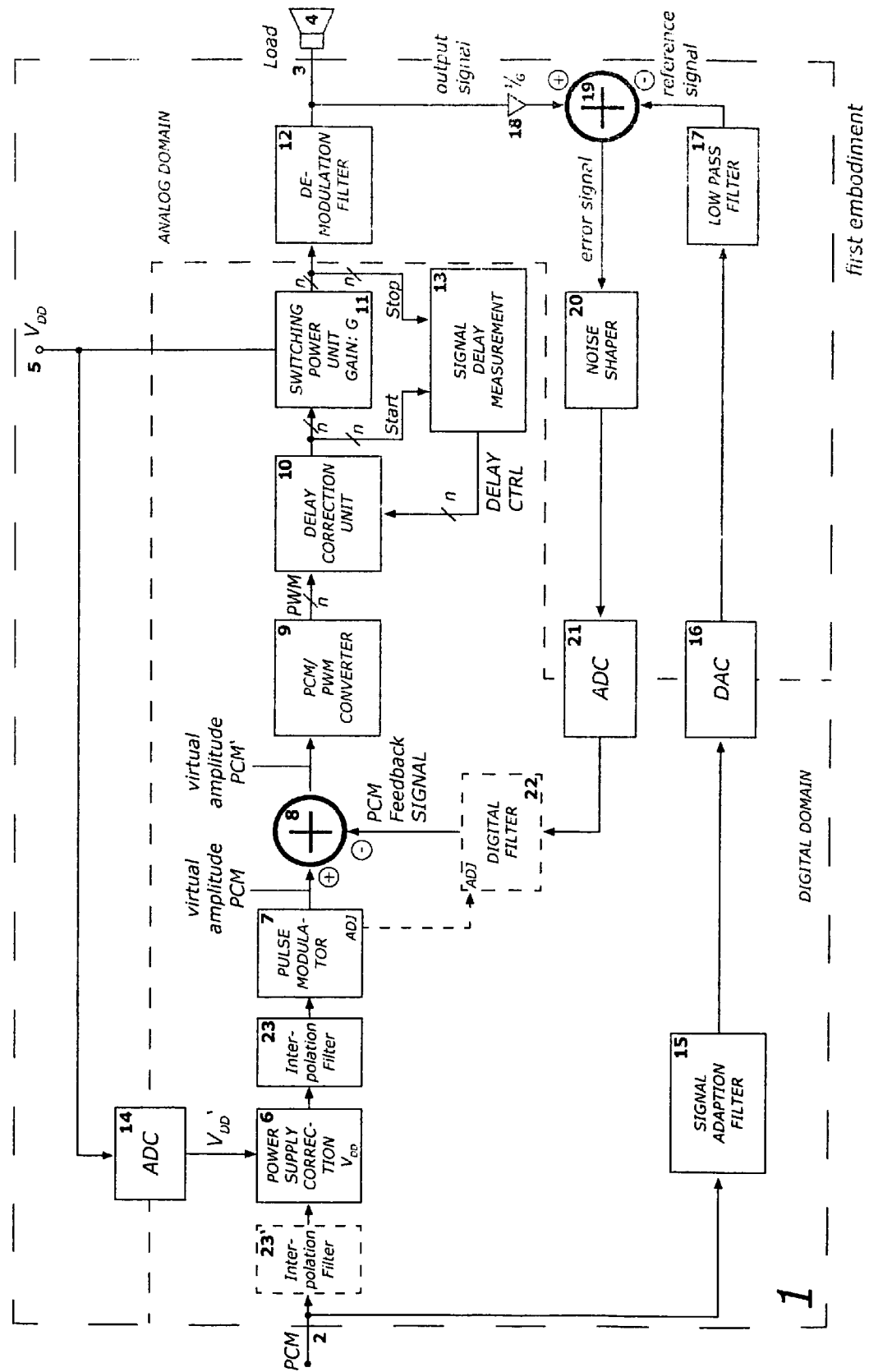
FIG. 5 is a block diagram of a first embodiment of the switching power amplifier according to the present invention.

FIG. 5 shows a block diagram of a first embodiment of the switching power amplifier 1 according to the present invention. The switching power amplifier 1 receives a input signal applied to a signal input 2 of the switching power amplifier 1. The switching power amplifier 1 amplifies the input signal and outputs an amplified analogue signal at an output 3 to a load 4 such as loudspeaker. At a power supply terminal 5 the switching power amplifier 1 is supplied with a power supply voltage $V_{DD}$. The switching power amplifier 1 includes components in the digital domain and components in the analogue domain as can be seen from FIG. 5. The input signal is either analogue or digital.

Furthermore, the switching power amplifier 1 according to the present invention as shown in FIG. 5 comprises a first signal path and a second reference signal path. The first signal path comprises a power supply correction unit 6, a pulse modulator 7 for modulating the applied digital input signal, a substractor 8 for substracting a digital feedback signal, a converter 9 for converting the difference signal generated by the substractor 8 into a pulse width modulated signal, a delay correction unit 10 which compensates the variation of signal edges of the modulated signal, a switching power unit 11 which amplifies the modulated signal to generate an amplified output signal and, finally, a demodulation filter 12 which filters the amplified output signal generated by the switching power unit 11 to generate an analogue output signal output to the load 4. Parallel to the switching power unit 11 a signal delay measurement unit 13 is provided which measures the signal delays caused by the switching power unit 11 to generate a delay control signal for the delay correction unit 10.

The power supply correction unit 6 divides a digital input signal by a digital power supply value generated by an analogue-to-digital-converter 14. Errors caused by power supply variations are minimized by the power supply correction unit 6.

Besides the first signal path a second signal path is provided within the switching power amplifier 1 for generating a reference signal in response to the digital input signal applied to the signal input 2. The second signal path comprises a digital signal adaption filter 15, a digital analogue converter 16 and an analogue low-pass filter 17. In a preferred embodiment the digital analogue converter 16 comprises an oversampling unit. In an alternative embodiment oversampling is performed within the digital filter 15. The digital signal adaption filter 15 causes preferably a delay for compensation of the delay in the first signal path a compensative for the low-pass filter 17 in the audio frequency range. The digital analogue converter 16 converts the filter digital input signal output by the signal-adaption filter 15 to generate an analogue signal which is filtered by the low-pass filter 17 to generate a reference signal.

The transfer function $H_{SP}$ of the signal path between signal input 2 and output 3 is equal to the transfer function $H_{RP}$ of the reference signal path between signal input 2 and the output of the low-pass filter 17.

The analogue output signal filtered by the demodulation filter 12 is applied to a scaling unit 18 which scales the amplitude of the amplified output signal down according to a scaling factor. The scaling factor is indirect proportional to a signal gain G provided by the switching power unit 11. The scaled down amplified output signal is applied to an analogue substractor 19 which substracts from the scaled down output signal the reference signal output by the second signal path to generate an error signal.

The switching power amplifier 1 according to the present invention has a Sigma-Delta-feedback-loop which comprises the analogue substractor 19, an analogue noise shaper 20 for integrating the error signal and a quantizer 21 for converting the integrated error signal into a digital feedback signal which is fed back to the first signal path, i.e. the digital feedback signal is substracted from the modulated signal by means of the substractor 8.

Figure 14:
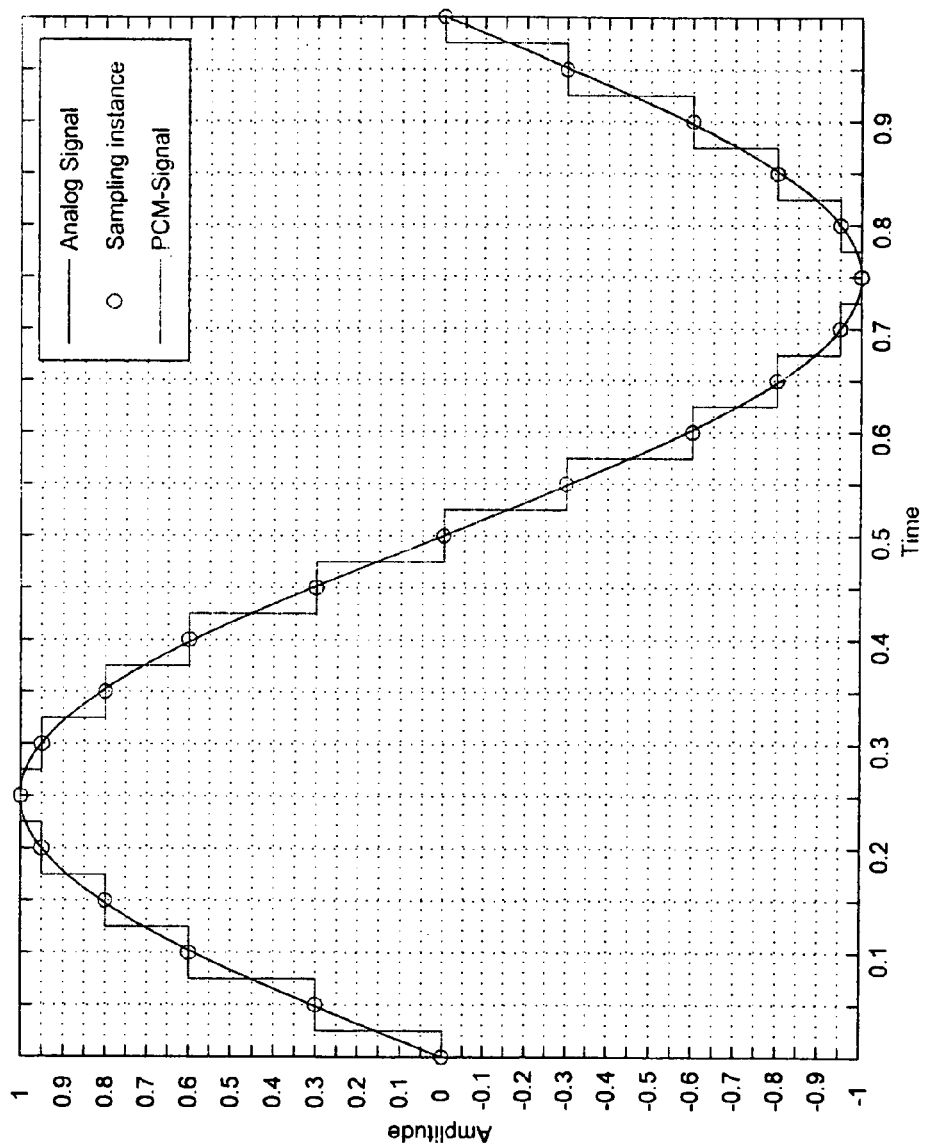
FIG. 14 shows a signal diagram for illustrating the generation of a PCM-signal as employed within the switching power amplifier according to the present invention.

In the embodiment shown in FIG. 5 the digital input signal is a PCM-pulse code modulated signal. The most common digital audio-signals are pulse code modulated signals. PCM digital audio is typically sampled at 44.1 kHZ, e.g. for CD-recordings or higher for professional audio applications. In comparison, speech signals for telephony are only sampled at 8 KHz. Higher sample rates for professional recordings include 48 kHz, 96 kHz and 192 kHz. A PCM-signal is a digital representation of an analogue signal wherein the magnitude of the signal is sampled regularly at uniform intervals as shown in FIG. 14. Every sample is quantized to a series of symbols in a digital code which is usually a binary code.

The amplitude of each sample is a numeric value that is represented by a certain number of bits. The more bits are used to represent the amplitude the greater the dynamic range that can be represented with each bit providing a gain of approximately 6 dB. The dynamic range of 16-bit-digitalaudio-signals is therefore approximately 96 dB whereas the dynamic range of a 24-bit-digital-audio-signal is nearly 144 dB.

An alternative digital representation of an audio-signal is provided by Direct Stream Digital or DSD. Digital signals coded in this data format represent a sequence of 1-bit-values which are generated by a Delta-Sigma-converter which quantizes with 1-Bit-resolution an applied analogue input signal and which feedbacks via a filter the errors caused by a course quantization. DSD is used, for instance in SACD-players.

As can be seen from FIG. 5 the first signal path of the power amplifier 1 comprises a power supply correction unit 6 and a signal delay measurement unit 13. The power supply correction unit 6 divides an input signal by the analogue-to-digital-converted power supply voltage $V_{DD'}$ applied to the switching power unit 11. The delay correction unit 13 compensates a variation of signal edges of the modulated signal applied to the switching power unit 11. By providing these correction mechanism the error signal, i.e. the difference between the scaled output signal and the reference signal is minimized in the audio-frequency range. This has the advantage that the resolution of the analogue digital converter 21 provided within the feedback loop can be comparatively low since the analogue digital converter 21 has only to convert the difference between an ideal reference signal and the realized output signal output by the modulation filter 12.

The analogue digital converter 21 performs the quantization of the integrated error signal output by the noise shaper 20. Quantization is a process of approximating a continuous range of values by a relatively small set of discrete symbols or integer values. The analogue-to-digital-converter 21 performs the quantization with a quantization level specified in bits. Since the analogue-to-digital-converter 21 has only to quantize a difference signal and not the complete range of the output signal the number of quantization steps within the quantizer 21 can be relatively low. Consequently, the complexity of the quantizer 21 provided within the feedback loop of the switching power amplifier 1 according to the present invention is relatively low. This leads to a relatively high operating frequency of the quantizer 21. The provision of the power supply correction unit 6 and the signal delay measurement unit 13 further minimizes the amplitude range of the difference signal so that the complexity of the analogue-to-digital-converter 21 is further reduced. The variation of the power supply voltage $V_{DD}$ is measured by the analogue-to-digital-converter so that the power supply correction unit 6 can compensate any variation of the power supply voltage.

Variations of the delays of the signal edges caused by switching transistors within the switching power unit 11 are compensated by the signal delay measurement unit 13.

The error signal output by the substractor 19 is applied to a noise shaper 20. The noise shaping filter 20 has in principle a PI frequency response. The noise shaper 20 comprises in a preferred embodiment several integration stages for integrating the error signal.

In the following, the switching power amplifier 1 according to the present invention as shown in FIG. 5 is described in more detail with reference to FIGS. 6 to 13 which show components within the switching power amplifier 1.

In the preferred embodiment as shown in FIG. 5 the digital input signal is a PCM-signal. The pulse modulator calculates in response to the digital PCM-input-signal a desired pulse width modulated output signal ($PWM_{ideal}$) to be amplified by the switching power unit 11 for to the load 4 and generates a corresponding pulse code modulated PCM signal with a virtual amplitude ($PCM_{virt}$) which is output to a substractor 8 provided within the first signal path. The pulse modulator 7 is in a preferred embodiment a natural pulse width modulator (NPWM) This modulator adapts the PCM-sample to the switching frequency of the switching power unit 11. In alternative embodiments of the power amplifier 1 according to the present invention the pulse modulator 7 is a click-modulator or a uniform pulse width modulator (UPWM). From the PCM-signal with the virtual amplitude generated by the pulse modulator 7 a PCM-feedback-signal generated by the quantizer 21 is substracted by means of the substractor 8. In a possible embodiment a digital filter 22 is provided between the quantizer 21 and the substractor 8. The output signal of the digital filter 22 as shown in FIG. 5 is multiplied in a preferred embodiment with a constant control or adjustment value (ADJ) output by the pulse modulator 7. This adjustment value is a scaling factor formed by the first derivation of the PCM-signal applied to the input of the pulse modulator 7. The digital filter 22 is in a preferred embodiment an integrating filter which allows to broaden the input signal range of the analogue digital converter 21. A PCM-signal having the virtual amplitude is generated by the pulse modulator 7 in such a manner that when the PCM-feedback-signal is Zero the pulse width modulated signal output by the PCM/PWM-converter 9 is ideal.

Figure 6:
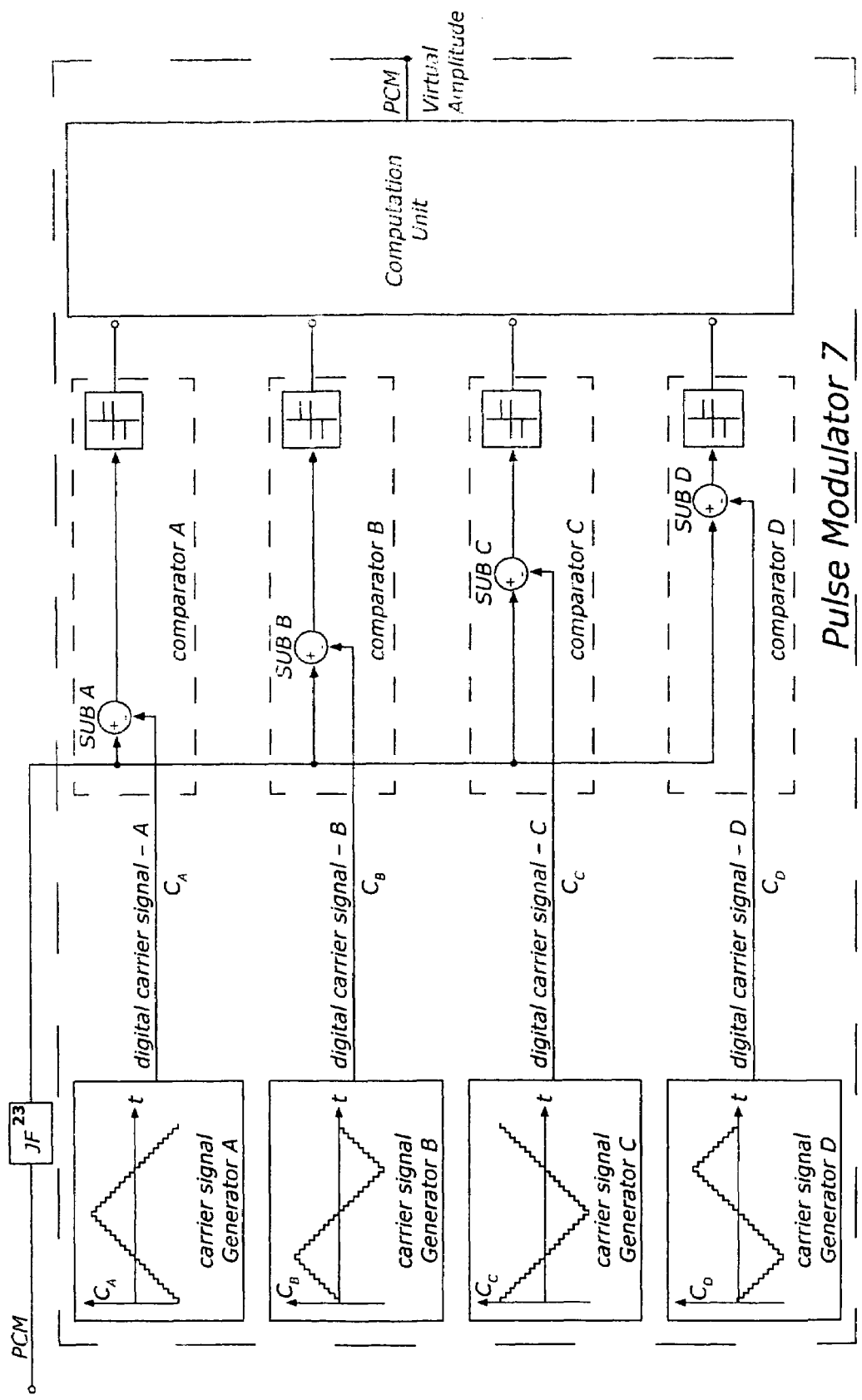
FIG. 6 is a block diagram of a preferred embodiment of the pulse modulator provided within the switching power amplifier according to the present invention.

FIG. 6 shows a preferred embodiment of the pulse modulator 7 within the switching power amplifier according to the present invention as shown in FIG. 5. The pulse modulator 7 receives a PCM-coded input signal. The pulse modulator 7 as shown in FIG. 6 comprises four carrier signal generators A, B, C, D generating digital carrier signals. The carrier signal generators A-D comprise in a preferred embodiment up and down counters generating phase-shifted digital carrier signals. The pulse modulator 7 also comprises four comparators A-D each receiving a corresponding digital carrier signal from a carrier signal generator and the PCM-input signal from the power supply correction unit 6. Each comparator A-D compares the PCM-input signal with the digital carrier signal by substracting the digital carrier signal from the PCM-input signal by means of a substractor and comparing the difference with Zero. The comparison results are applied to a computation unit which calculates the PCM-signal having a virtual amplitude ($PCM_{virt}$). The PCM-signal is calculated such that, when the PCM-feedback signal is Zero, the PCM/PWM-converter 9 as shown in FIG. 5 will generate an ideal pulse width modulated signal ($PWM_{ideal}$). In a preferred embodiment an interpolation filter 23 for upsampling is provided at the input of the pulse modulator 7.

Figure 7:
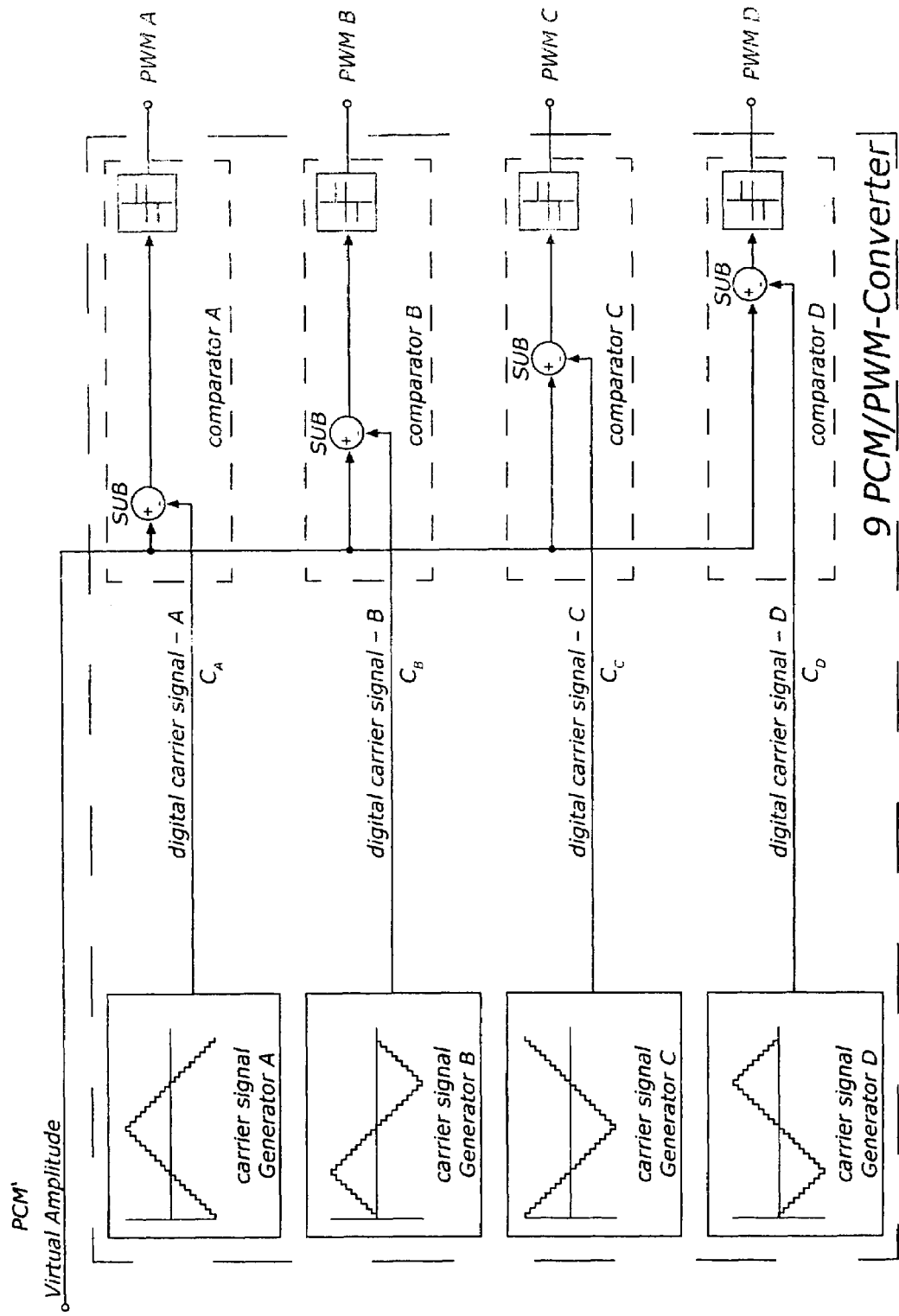
FIG. 7 shows a preferred embodiment of the PCM/PWM converter as provided within the switching power amplifier according to the present invention.

FIG. 7 shows a preferred embodiment of the PCM/PWM-converter 9 within the switching power amplifier 1 as shown in FIG. 5. The PCM/PWM-converter 9 is structured similarly to the pulse modulator 7 as shown in FIG. 6. The PCM/PWM-converter 9 receives a difference signal from the substractor 8. The substractor 8 applies the difference between the PCM-signal having the virtual amplitude generated by the pulse modulator 7 and the PCM-feedback signal output by the quantizer 21. This difference signal PCM' is applied to four comparators A-D within in the PCM/PWM-converter 9. Like the pulse modulator 7 the PCM/PWM-converter 9 comprises four carrier signal generators A-D generating four phase-shifted digital carrier signals applied to the corresponding comparators A-D.

Figure 15:
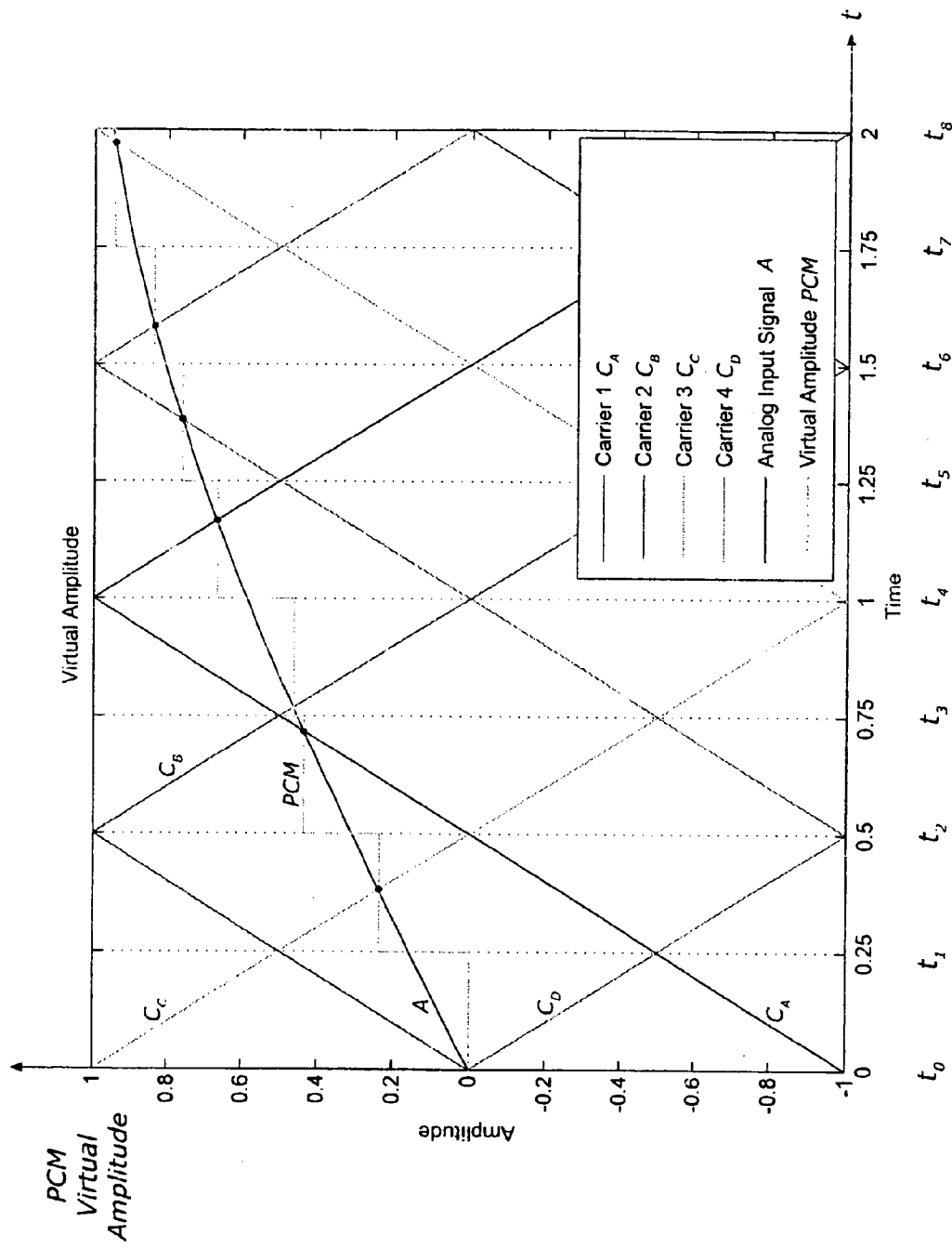
FIG. 15 shows a signal diagram for illustrating a virtual amplitude PCM-signal as employed within the switching power amplifier according to the present invention.

FIG. 15 illustrates a generation of a PCM-signal having a virtual amplitude by the pulse modulator 7. From the generated PCM-signal the PCM-feedback signal is substracted and the difference signal is applied to the PCM/PWM-converter 9 as shown in FIG. 7.

Figure 16:
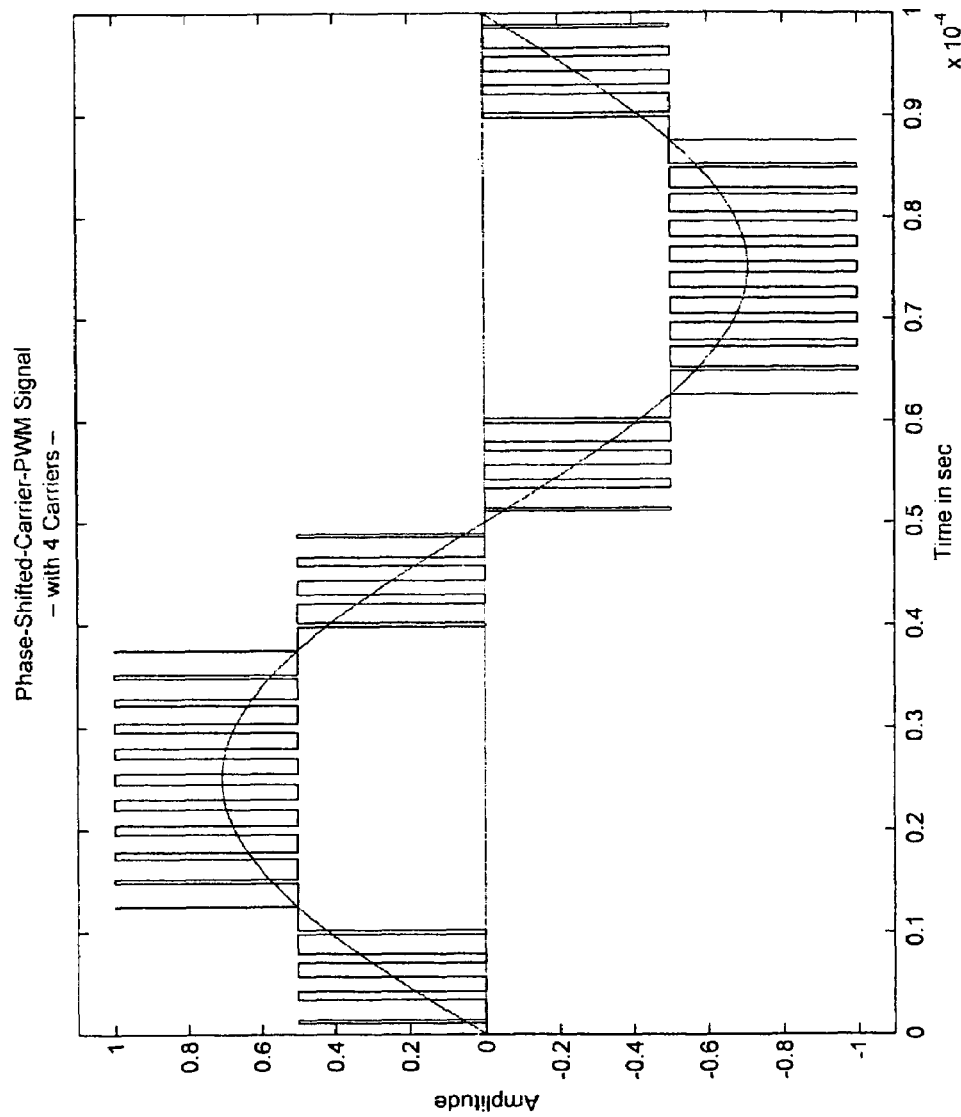
FIG. 16 shows a signal diagram of a phase-shifted carrier pulse width modulated signal as employed within the switching power amplifier according to the present invention.

FIG. 16 shows a phase-shifted carrier pulse width modulated signal with four carriers. By using pulse width modulated signals having more than two amplitudes the carrier information is two-dimensional. The two-dimensional information of the next switching point is calculated into a frame-wise constant amplitude as shown in FIG. 15. The PCM/PWM-converter 9 comprises the same carrier signal generators A-D as the pulse modulator 7. The PCM-signal has a frame-wise constant amplitude which intersects the corresponding carrier at the desired switching time. By this way, the carrier information becomes one-dimensional and coded into the amplitude and not into the time. A corresponding quantized further amplitude signal, i.e. a PCM-feedback signal is substracted by means of the substractor 8 from the PCM-signal having the virtual amplitude.

Figure 8:
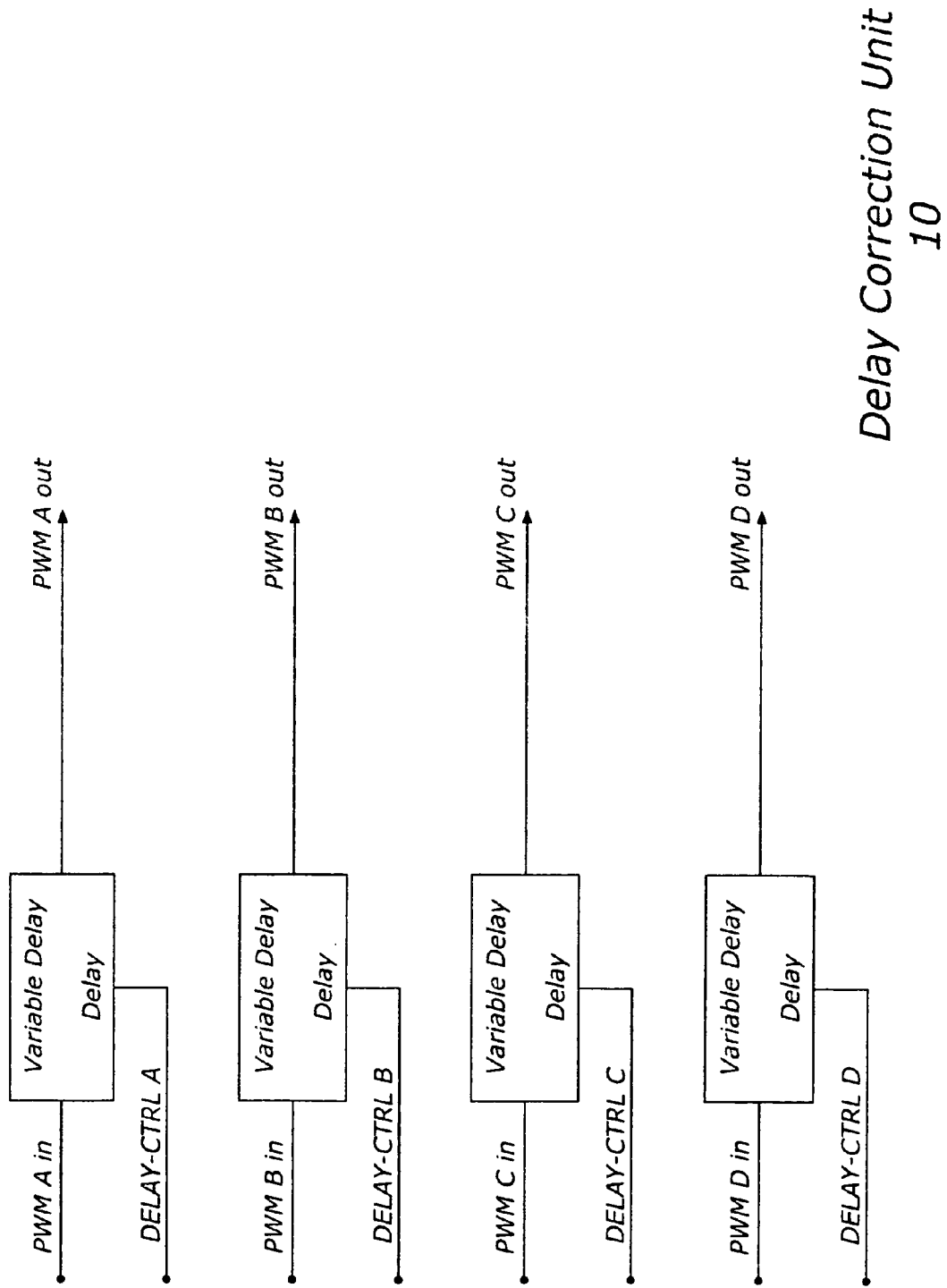
FIG. 8 shows a preferred embodiment of the delay correction unit as provided within the switching power amplifier according to the present invention.

The PCM/PWM-converter 9 as shown in FIG. 7 outputs four pulse width modulated signals PWMA to PWMD. The pulse width modulated signals are output to the delay correction unit 10 as shown in FIG. 5. FIG. 8 shows a delay correction unit 10 in more detail. For each pulse width modulated signal the delay correction unit 10 comprises a controllable delay element. Each controllable delay element has a control input and receives a delay control signal Delay-CRTL from the signal delay measurement unit 13 as shown in FIG. 5. The delay element delays the corresponding pulse width modulated input signal with a variable time delay in response to the delay control signal received from the signal delay measurement unit 13. The variable delay is provided for compensating the variation of signal edges caused by switching power unit 11.

Figure 9:
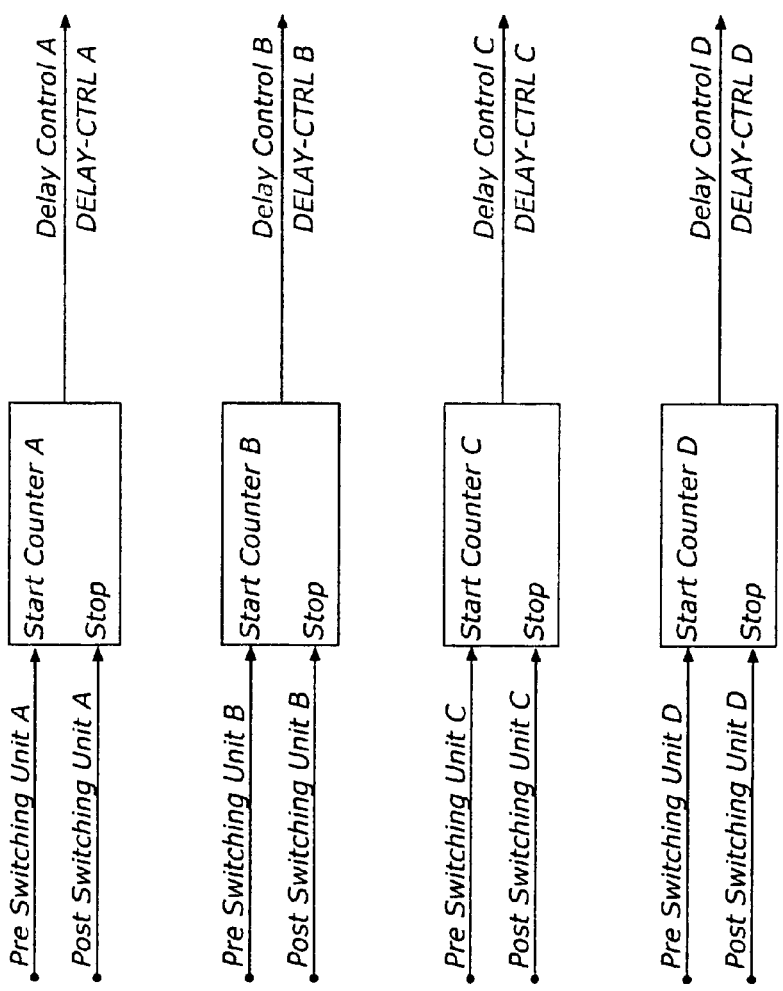
FIG. 9 shows a preferred embodiment of a signal delay measurement unit as provided within the switching power amplifier according to the present invention.
Figure 10:
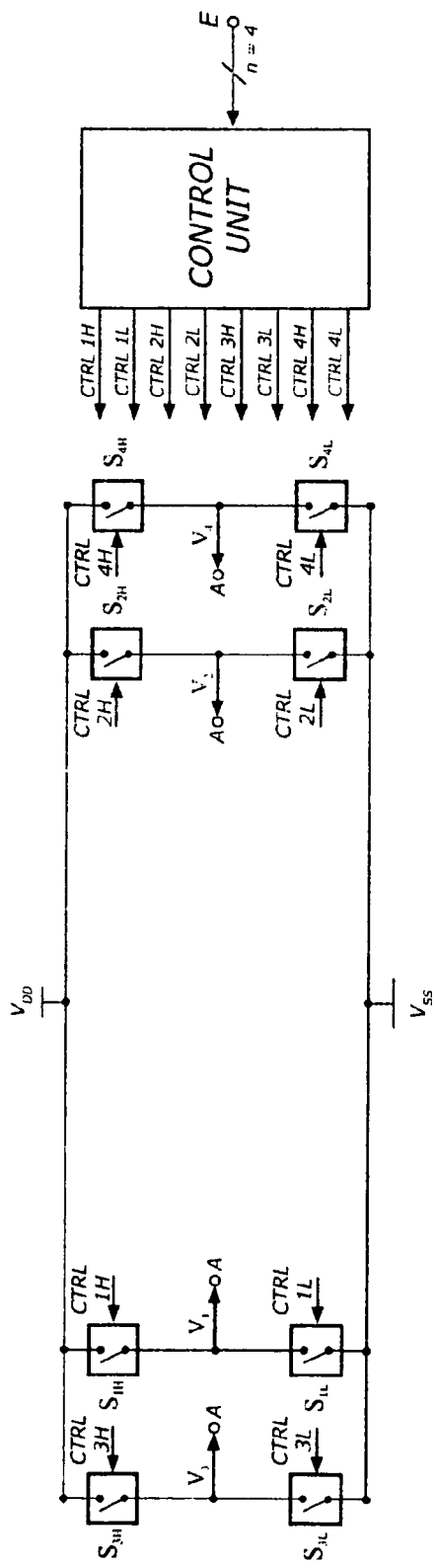
FIG. 10 shows a preferred embodiment of a switching power unit provided within the switching power amplifier according to the present invention.

FIG. 9 shows a signal delay measurement unit 13 generating the delay control signals for the delay correction unit 10 in detail. The signal delay measurement unit 13 comprises for each pulse width modulated signal a corresponding counter. The switching power unit 11 comprises in a preferred embodiment for each received pulse width modulated signal PWM from the PCM/PWM-converter 9 a corresponding switching power unit stage A-D. The switching power unit stages 11A-11D are connected as shown in FIG. 10. The number of switching power stages corresponds to the number n of digital carrier signals. For each switching power stage 11A-11D within the switching power unit 11 a corresponding counter A-D is provided within the signal delay measurement unit 13. Each counter receives a start signal from the input side of the corresponding switching power stage 11A-11D and a stop signal from the output from the corresponding switching power stage 11A-11D. The signal edge triggers the corresponding counter to start the counting process. When the signal edge reaches the output of the corresponding switching power stage the counting process is stopped. The count value is proportional to the time delay between the input and the output of the switching power stage 11A-11D. The count value is output as a Delay-Control-signal to the corresponding delay element of the delay correction unit 10 as shown in FIG. 8. The delay is measured and corrected independently for the rising and falling slope of the switching signal.

FIG. 10 shows a preferred embodiment of the switching power unit 11 within the switching power amplifier 1 as shown in FIG. 5. A control unit within the switching power amplifier 1 receives the delayed output signals of the delay correction unit 10 and controls switches S, accordingly. The switches are formed in a preferred embodiment by IGBTs or MOSFETS.

Figure 11:
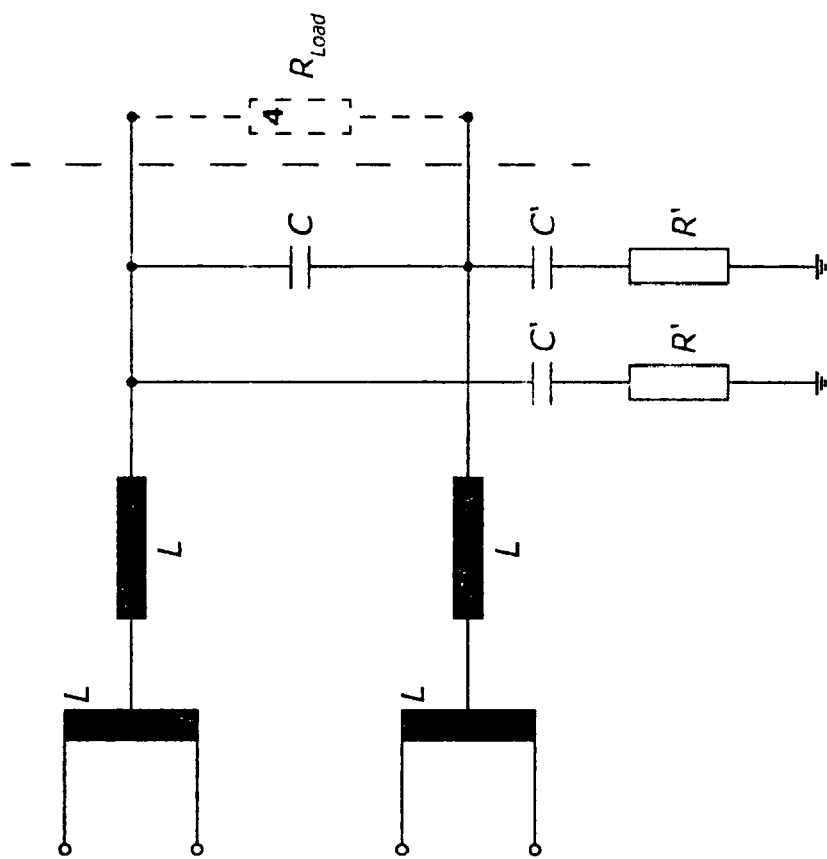
FIG. 11 shows a preferred embodiment of a demodulation filter as provided within the switching power amplifier according to the present invention.

FIG. 11 shows a preferred embodiment of the analogue demodulation filter 12 provided within the switching power amplifier 1 according to the present invention as shown in FIG. 5. The demodulation filter 12 is a passive LC-filter of $2^{nd}$ order. The demodulation filter 12 filters the amplified output signal generated by the switching power unit 11 to generate an analogue output signal for the load 4.

Figure 12:
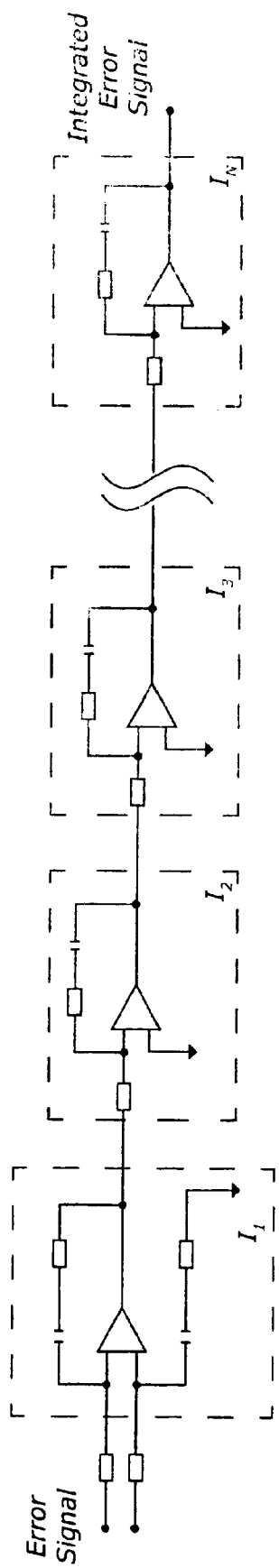
FIG. 12 shows a preferred embodiment of a noise shaper as provided within the switching power amplifier according to the present invention.

FIG. 12 shows a preferred embodiment of the analogue noise-shaper 20 within the Sigma-Delta-feedback-loop of the switching power amplifier 1 according to the present invention as shown in FIG. 5. A noise shaper 20 is provided for integrating the error signal output by the substractor 19. The noise shaper 20 comprises a predetermined number N of integration stages The integrated error signal is output by the quantizer 21.

Figure 13:
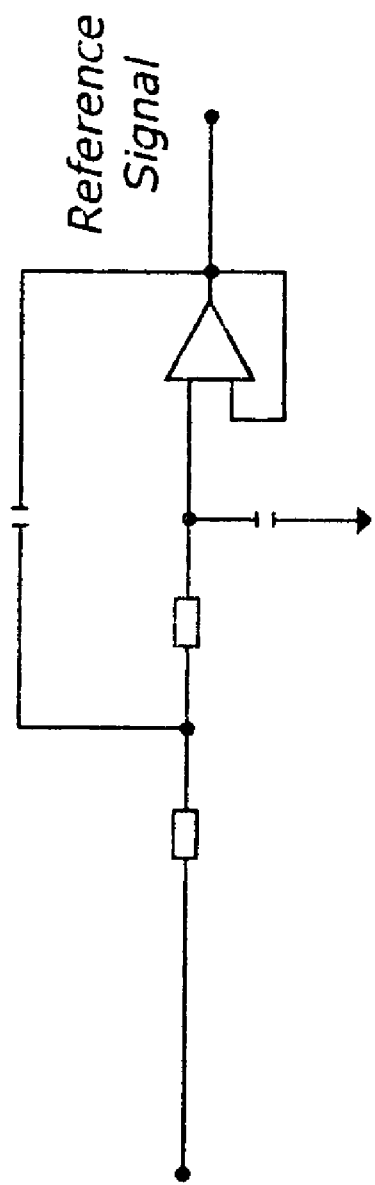
FIG. 13 shows a preferred embodiment of a low-pass filter as employed within the switching power amplifier according to the present invention.

FIG. 13 shows a preferred embodiment of the low-pass filter 17 provided in the reference signal path. The low-pass filter 17 is an active analogue filter having a transfer function which corresponds to the transfer function of the demodulation filter 12 including the load 4 in the low audio-frequency range.

Figure 17:
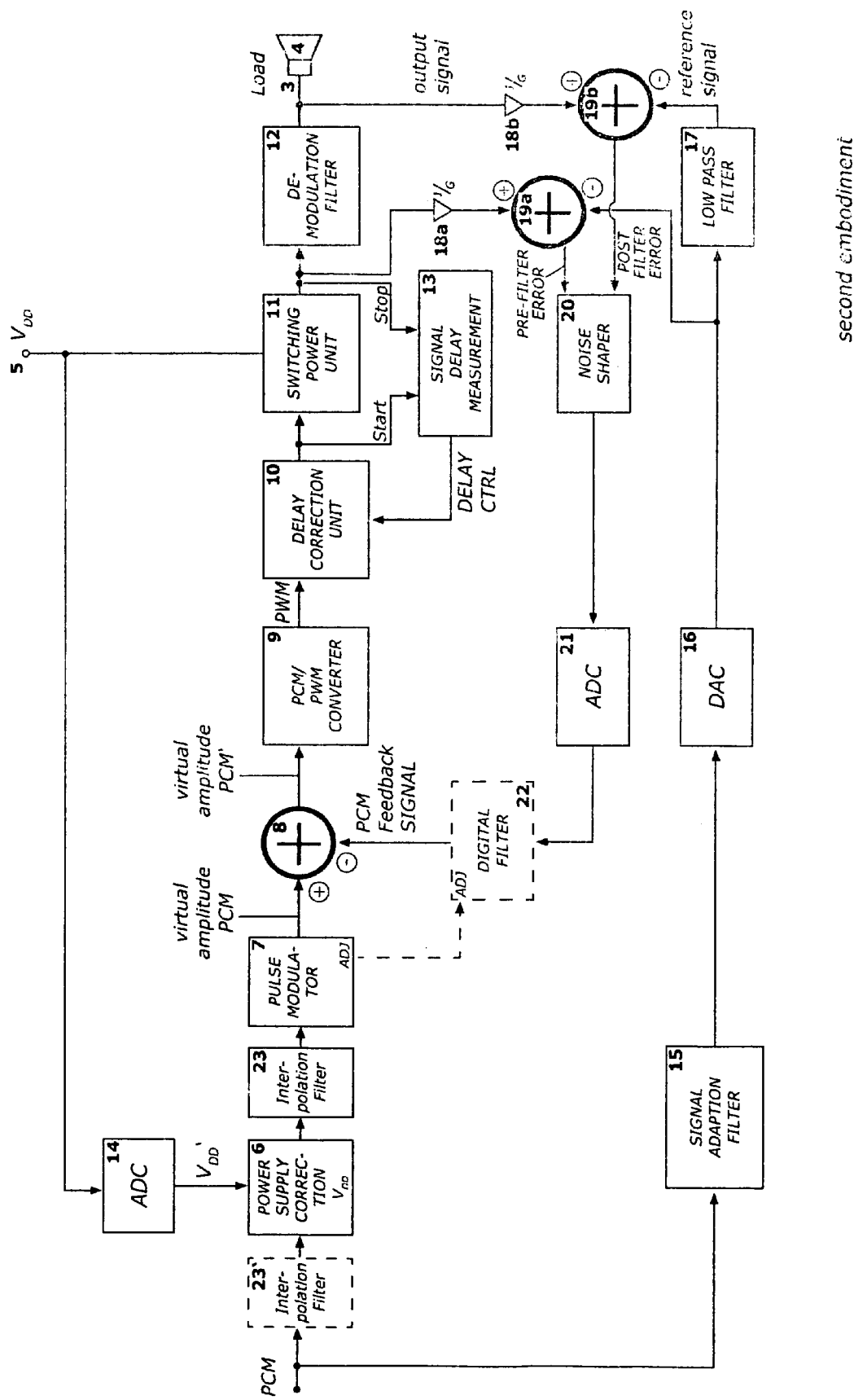
FIG. 17 shows a second embodiment of the switching power amplifier according to the present invention.

FIG. 17 shows a second embodiment of the switching power amplifier 1 according to the present invention. In this embodiment, the noise shaper 20 receives a pre-filter error signal from the first substractor 19a and a post-filter error signal from the second substractor 19b. The first substractor 19a generates the pre-filter error signal by substracting from the scaled down output signal of the switching power unit 11 the input signal applied to the low-pass filter 17. The second substractor 19b generates the post-filter error signal by substracting from the scaled down demodulated output signal of the demodulation filter 12 the reference signal output by the low-pass filter 17.

Figure 18:
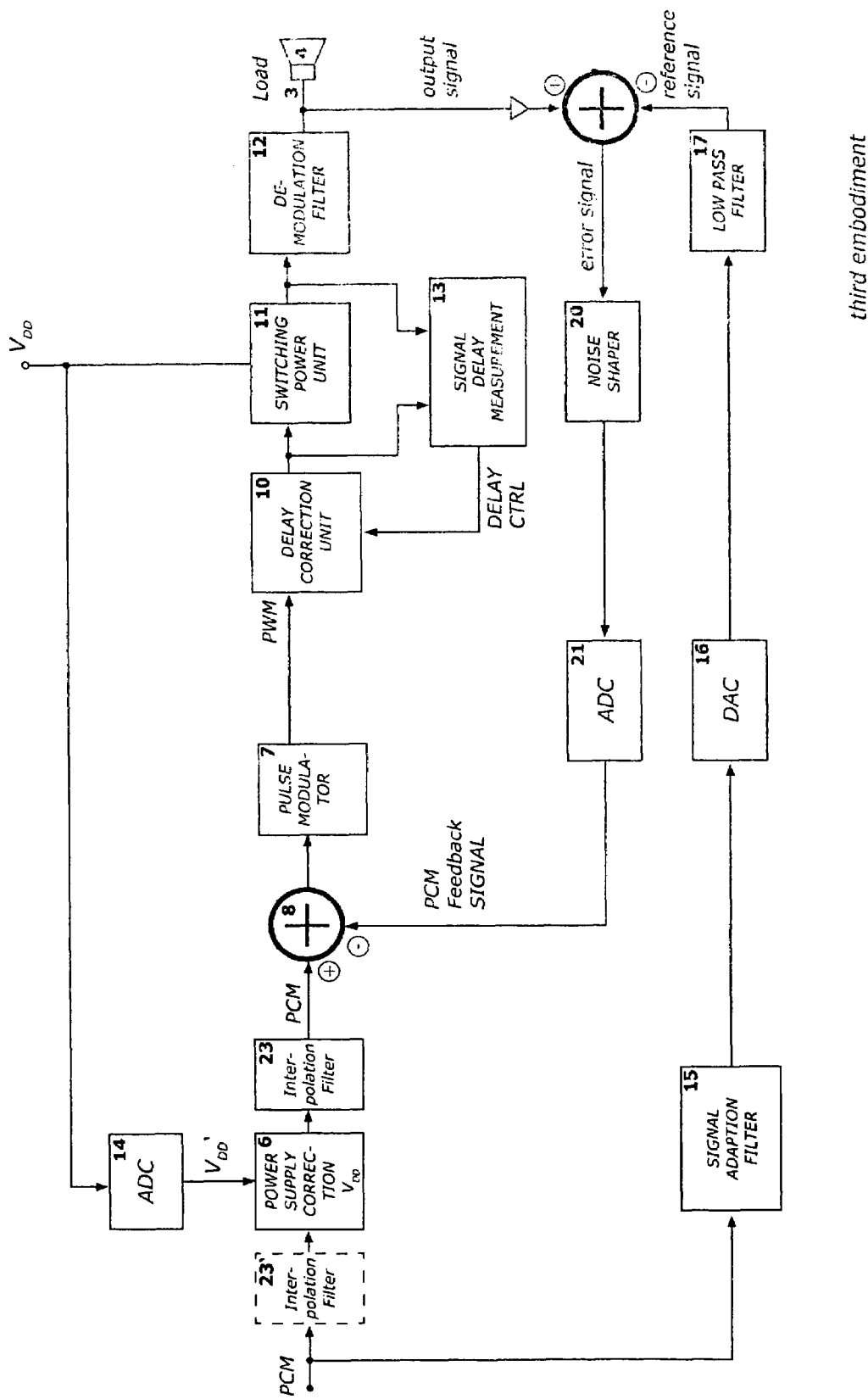
FIG. 18 shows a third embodiment of the switching power amplifier according to the present invention.

FIG. 18 shows a third embodiment of the switching power amplifier 1 according to the present invention. In this embodiment the substracting means 8 which closes the feedback loop is provided at the input side of the pulse modulator 7 and substracts from the PCM-signal output by the power supply correction unit 6 the PCM-feedback signal generated by the quantizer 21. The generated difference signal is forwarded to a pulse modulator transforming the PCM-difference signal to a pulse width modulated signal (PWM).

Figure 19:
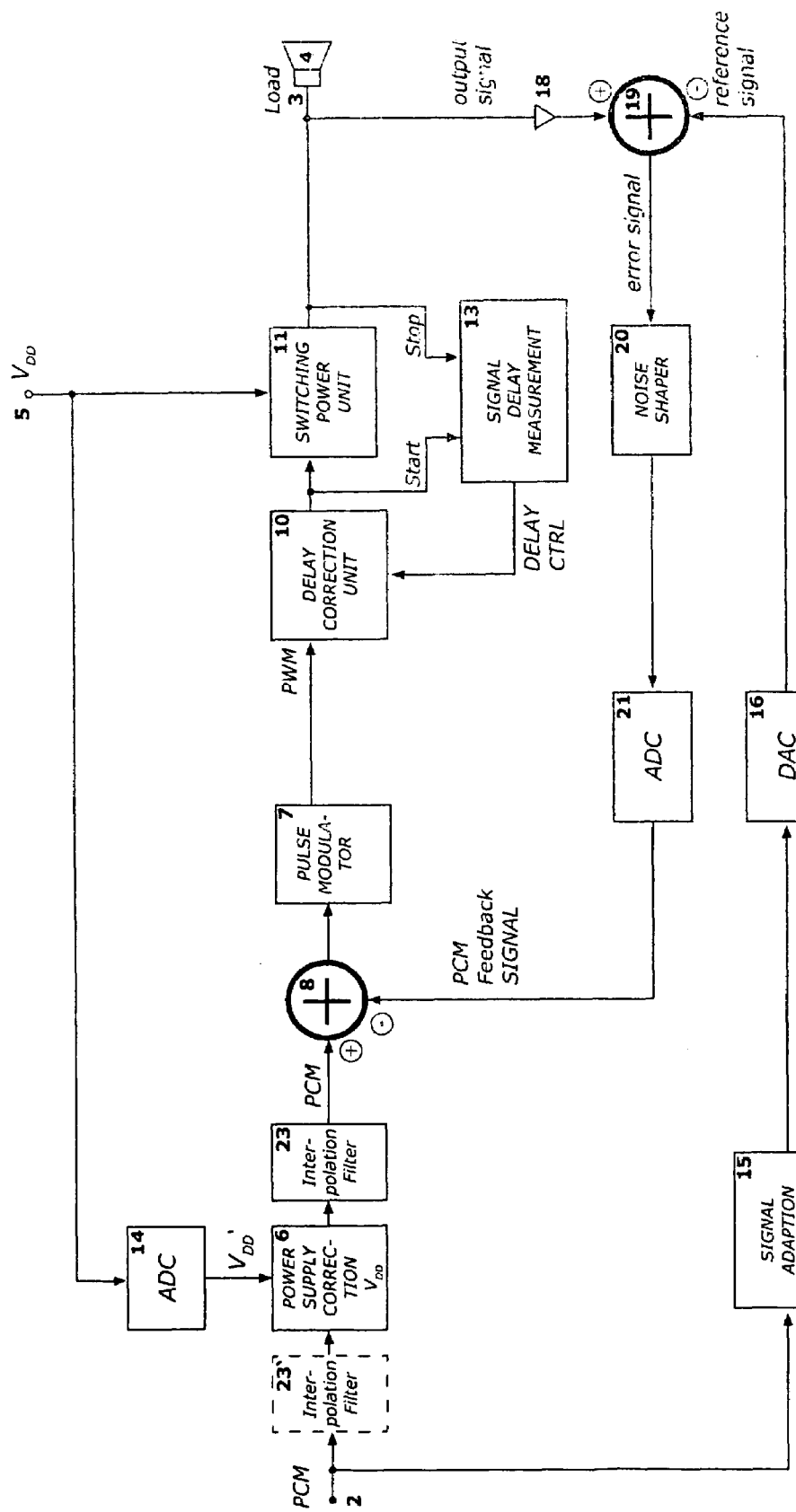
FIG. 19 shows a fourth embodiment of the switching power amplifier according to the present invention.

FIG. 19 shows a fourth embodiment of the switching power amplifier 1 according to the present invention. For some applications it is not necessary to provide a demodulation filter 12 and a low-pass filter 17. The pulse modulator 7 of the third and fourth embodiment does not comprise a computation unit as shown in FIG. 6.

A switching power amplifier 1 according to the present invention is a digital switching power amplifier with a very high efficiency wherein the feedback loop is closed in the digital domain. The digital switching power amplifier 1 according to the present invention can be used in many technical fields. Besides amplifying audio-signals the switching power amplifier 1 might be used for controlling motors or for other purposes.

The structure of the switching power amplifier 1 allows the use of many types of pulse width modulated signals, i.e. pulse width modulated signals having more than two amplitudes. By providing a power supply correction unit 6 and a signal delay measurement unit 13 in the first signal path it is possible to minimize the amplitude range of the integrated error signals and consequently the necessary amplitude range of the analogue-to-digital-converter 21. By noise shaping of the error signal it is possible to compensate errors of the analogue-to-digital-converter 21. The noise shaper works as a compensation filter damping noise in the audio-frequency range.

In a preferred embodiment the demodulation filter 12, the noise shaper 20 and the low-pass filter 17 as well as the substractor 19 are integrated into one circuit. The invention further provides a method for amplifying a digital input signal. In a first step the digital input signal is modulated by means of a pulse modulator. In a further step the modulated signal is amplified to generate an amplified output signal. Furthermore, a reference signal is generated in response to the digital input signal. By substracting the generated reference signal from the amplified input signal, an error signal is generated. The error signal is integrated by means of an analogue noise shaper. Then the integrated error signal is converted into a digital feedback signal which is substracted from the modulated digital input signal.

The invention claimed is:

1. Switching power amplifier comprising:
   (a) a first signal path having
      (a1) a pulse modulator for modulating an input signal; and
      (a2) a switching power unit for amplifying the modulated signal to generate an amplified output signal;
   (b) a second signal path for generating a reference signal in response to the input signal; and
   a sigma delta feedback loop having
      (c1) a substractor for substracting the generated reference signal from the amplified output signal to generate an error signal;
      (c2) an analogue noise shaper for integrating the error signal to generate an integrated error signal; and
      (c3) a quantizer for converting the integrated error signal into a digital feedback signal which is fed back to the first signal path.

2. Switching power amplifier according to claim 1, wherein the input signal is a digital PCM-signal.

3. Switching power amplifier according to claim 1, wherein the first signal path comprises a demodulation filter which filters the amplified output signal generated by said switching power unit to generate an analogue output signal for a load.

4. Switching power amplifier according to claim 3, wherein the demodulation filter is a passive low-pass filter.

5. Switching power amplifier according to claim 1, wherein the switching power unit comprises at least one class-D-power-stage.

6. Switching power amplifier according to claim 1, wherein the second signal path comprises
   a signal adaption filter for filtering the input signal, a digital-to-analogue-converter which converts the filtered digital input signal output by said digital signal adaption filter to generate an analogue signal; and
   an analogue low-pass filter which filters the analogue signal output by said digital to analogue converter to generate said reference signal.

7. Switching power amplifier according to claim 6, wherein the digital signal adaption filter has a predetermined delay time.

8. Switching power amplifier according to claim 1, wherein the switching power unit amplifies the modulated signal with a predetermined signal gain.

9. Switching power amplifier according to claim 8, wherein a scaling unit scales the amplitude of the amplified output signal down with a scaling factor and outputs the scaled signal to the substractor,
wherein the scaling factor is indirect proportional to the signal gain provided by the switching power unit.

10. Switching power amplifier according to claim 1, wherein the first signal path further comprises a power supply correction unit which divides the digital input signal by the analogue to digital converted power supply voltage of said switching power unit.

11. Switching power amplifier according to claim 1, wherein the first signal path further comprises a delay correction unit which compensates a variation of signal edges of the modulated signal applied to said switching power unit.

12. Switching power amplifier according to claim 2, wherein the pulse modulator calculates in response to the digital PCM input signal a desired pulse width modulated set output signal to be amplified by said switching power unit to said load and generates a corresponding pulse code modulated signal with a virtual amplitude which is output to a substractor provided within said first signal path.

13. Switching power amplifier according to claim 1, p1 wherein the pulse modulator is a natural pulse width modulator.

14. Switching power amplifier according to claim 1, wherein the pulse modulator is a click modulator.

15. Switching power amplifier according to claim 1, wherein the pulse modulator is a uniform sampling pulse width modulator.

16. Switching power amplifier according to claim 12, wherein the substractor substracts from the PWM-signal having a virtual amplitude a digital feedback signal generated by said sigma delta feedback loop.

17. Switching power amplifier according to claim 1, wherein the digital feedback signal is a PCM-signal.

18. Switching power amplifier according to claim 1, wherein a further digital filter is provided for filtering a digital feedback signal output by said quantizer of said sigma delta feedback loop.

19. Switching power amplifier according to claim 16, wherein a PCM/PWM-converter is provided within said first signal path for converting the digital PCM output signal of said substractor to a pulse width modulated signal output to said delay correction unit.

20. Switching power amplifier according to claim 19, wherein the PCM/PWM-converter comprises
at least one carrier signal generator for generating a digital carrier signal and
a corresponding comparator connected to said carrier signal generator which compares the PCM-signal having a virtual amplitude output by said substractor with the carrier signals generated by the carrier signal generator to generate a corresponding pulse width modulated signal.

21. Switching power amplifier according to claim 20, wherein the PCM/PWM-converter comprises four carrier signal generators and four comparators.

22. Switching power amplifier according to claim 1, wherein the analogue noise shaper integrates a pre-filter error signal and a post-filter error signal.

23. Switching power amplifier according to claim 22, wherein the pre filter error signal is generated by a first substractor which substracts the output signal of the digital analogue converter provided within the second signal path from the amplified output signal of the switching power unit provided within the first signal path.

24. Switching power amplifier according to claim 22, wherein the post filter error signal is generated by a second substractor which substracts the reference signal output by the analogue low-pass filter provided within the second signal path from the filtered output signal output by the demodulation filter provided within the first signal path.

25. Switching power amplifier comprising
(a) a first signal path having a natural pulse width modulator for modulating a digital PCM input signal;
  a class-D-switching power unit for amplifying the modulated signal to generate an amplified output signal;
  a demodulation filter which filters the amplified output signal generated by said switching power unit to generate an analogue output signal for a load;
  a second signal path for generating a reference signal in response to the digital input signal;
(b) a sigma delta feedback loop having a subtractor for substracting the generated reference signal from the amplified output signal to generate an error signal;
(c) an analogue noise shaper for integrating the error signal to generate an integrated error signal;
(d) a quantizer for converting the integrated error signal to a digital feedback PCM-signal which is fed back to the first signal path.

26. Switching power amplifier comprising:
(a) a first signal path having
(a1) a power supply correction unit which divides a digital PCM-input signal by an analogue digital converter power supply voltage provided for a switching power unit;
(a2) a pulse modulator which calculates in response to the digital PCM-input signal a desired pulse width modulated set output signal and generates a corresponding pulse code modulated signal with a virtual amplitude;
(a3) a substractor which substracts a digital feedback signal from the pulse code modulated signal having a virtual amplitude;
(a4) a PCM/PWM converter which converts the digital pulse code modulated signal output by the substractor to a pulse width modulated signal;
(a5) a delay correction unit which compensates a variation of signal edges of the modulated signal;
(a6) a switching power unit for amplifying the modulated signal to generate an amplified output signal;
(a7) a demodulation filter which filters the amplified output signal generated by the switching power unit to generate an analogue output signal for a load;
(b) a second signal path having
(b1) a digital adaption filter for filtering the digital PCM-input signal;
  a digital-to-analogue-converter which converts the filtered digital input signal output by the digital signal adaption filter to generate an analogue signal;
(b2) an analogue low-pass filter which filters the analogue signal output by said digital-to-analogue-converter to generate a reference signal; and
(c) a sigma delta feedback loop having
(c1) a substractor for substracting the generated reference signal from the amplified output signal to generate an error signal;
(c2) an analogue noise shaper for integrating the error signal to generate an integrated error signal; and
(c3) a quantizer for converting the integrated error signal to a digital PCM-feedback signal which is fed back to the substractor provided within the first signal path.

27. Method for amplifying an input signal comprising the following steps:
(a) modulating the input signal by means of a pulse modulator;
(b) amplifying the modulated signal to generate an amplified output signal;
(c) generating a reference signal in response to the input signal;
(d) substracting the generated reference signal from the amplified output signal to generate an error signal;
(e) integrating the error signal to generate an integrated error signal by means of an analogue noise shaper; and
(f) converting the integrated error signal into a digital feedback signal which is substracted from the modulated input signal.

* * * * *

UNITED STATES PATENT AND TRADEMARK OFFICE
CERTIFICATE OF CORRECTION

PATENT NO. : 7,276,963 B2  Page 1 of 1
APPLICATION NO. : 11/221765
DATED : October 2, 2007
INVENTOR(S) : Carsten Wegner It is certified that error appears in the above-identified patent and that said Letters Patent is hereby corrected as shown below:

On the Title Page Item (73) should read,
Assignee: CAMCO Produktions-und Vertriebs GmbH fuer Beschallungs und Beleuchtungsanlagen At Column 12, line 21 (Claim 13, line 1) delete "p1", At Column 13, line 19 (Claim 25, line 12) (b) "subtractor" should be --"substractor"--

Signed and Sealed this

Twenty-seventh Day of May, 2008

JON W. DUDAS
*Director of the United States Patent and Trademark Office*